(12) United States Patent
Lee (10) Patent No.: US 8,907,206 B2
(45) Date of Patent: Dec. 9, 2014

(54) MULTI-JUNCTION SOLAR CELL DEVICES

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 113 days.

(21) Appl. No.: 13/189,508

(22) Filed: Jul. 24, 2011

(65) Prior Publication Data

US 2011/0277830 A1 Nov. 17, 2011

Related U.S. Application Data

(62) Division of application No. 12/271,704, filed on Nov. 14, 2008, now abandoned.

(60) Provisional application No. 60/988,414, filed on Nov. 15, 2007, provisional application No. 60/988,099, filed on Nov. 14, 2007.

(51) Int. Cl.
| | |
|---|---|
| H01L 31/00 | (2006.01) |
| H01L 31/0749 | (2012.01) |
| H01L 25/04 | (2014.01) |
| H01L 31/0725 | (2012.01) |

(52) U.S. Cl.
CPC ........ *H01L 31/0725* (2013.01); *H01L 31/0749* (2013.01); *Y02E 10/541* (2013.01); *H01L 25/045* (2013.01)
USPC ............ 136/255; 136/256; 136/264; 136/265

(58) Field of Classification Search
CPC . H01L 31/03; H01L 31/0264; H01L 31/0725; Y02E 10/54
USPC .................................. 136/243–293
See application file for complete search history.

(56) References Cited

U.S. PATENT DOCUMENTS

| | | | |
|---|---|---|---|
| 4,239,553 A | 12/1980 | Barnett et al. | |
| 4,446,916 A | 5/1984 | Hayes | |

(Continued)

FOREIGN PATENT DOCUMENTS

| | | |
|---|---|---|
| GB | 2332684 A | 6/1999 |
| WO | WO 2009/0149204 A1 | 12/2009 |
| WO | WO 2009/0158187 A1 | 12/2009 |
| WO | WO 2010/0025291 A2 | 3/2010 |
| WO | WO 2010/0039727 A1 | 4/2010 |
| WO | WO 2010/0107705 A1 | 9/2010 |

OTHER PUBLICATIONS

Masumdar et al, "Some studies on chemically synthesized antimony-doped CdSe thin films", Materials Chemistry and Physics 77 (2002) 669-676.*

(Continued)

*Primary Examiner* — Thanh-Truc Trinh (74) *Attorney, Agent, or Firm* — Kilpatrick Townsend & Stockton LLP (57) ABSTRACT

A photovoltaic cell structure for manufacturing a photovoltaic device. The photovoltaic cell structure includes a substrate including a surface region. A first conductor layer overlies the surface region. The photovoltaic cell structure includes a lower cell structure. The lower cell structure includes a first P type absorber layer using a first semiconductor metal chalcogenide material and/or other semiconductor material overlying the first conductor layer. The first P type absorber material is characterized by a first bandgap ranging from about 0.5 eV to about 1.0 eV, a first optical absorption coefficient greater than about $10^4$ cm$^{-1}$. The lower cell structure includes a first N$^+$ type window layer comprising at least a second metal chalcogenide material and/or other semiconductor material overlying the first P absorber layer. The photovoltaic cell structure includes an upper cell structure. The upper cell structure includes a second P type absorber layer using a third semiconductor metal chalcogenide material. The second P type absorber layer is characterized by a second bandgap ranging from about 1.0 eV to 2.2 eV and a second optical absorption coefficient greater than about $10^4$ cm$^{-1}$. A second N$^+$ type window layer comprising a fourth metal chalcogenide material overlies the second P absorber layer. A tunneling junction layer is provided between the upper cell structure and the lower cell structure.

12 Claims, 4 Drawing Sheets

(56) References Cited

U.S. PATENT DOCUMENTS

| | | | |
|---|---|---|---|
| 4,488,948 A | | 12/1984 | Larson et al. |
| 4,658,086 A | | 4/1987 | McLeod et al. |
| 4,710,589 A | | 12/1987 | Meyers et al. |
| 4,782,377 A | | 11/1988 | Mahan |
| 4,935,383 A | * | 6/1990 | Nouhi et al. ............... 117/104 |
| 4,996,108 A | | 2/1991 | Divigalpitiya et al. |
| 5,125,984 A | | 6/1992 | Kruehler et al. |
| 5,261,968 A | | 11/1993 | Jordan |
| 5,261,969 A | | 11/1993 | Stanbery |
| 5,397,401 A | | 3/1995 | Toma et al. |
| 5,501,744 A | | 3/1996 | Albright et al. |
| 5,536,333 A | | 7/1996 | Foote et al. |
| 5,578,503 A | | 11/1996 | Karg et al. |
| 5,665,175 A | | 9/1997 | Safir |
| 5,733,382 A | | 3/1998 | Hanoka |
| 5,834,331 A | | 11/1998 | Razeghi |
| 6,040,521 A | | 3/2000 | Kushiya et al. |
| 6,066,797 A | | 5/2000 | Toyomura et al. |
| 6,257,175 B1 | | 7/2001 | Mosher et al. |
| 6,288,325 B1 | | 9/2001 | Jansen et al. |
| 6,310,281 B1 | | 10/2001 | Wendt et al. |
| 6,320,115 B1 | | 11/2001 | Kataoka et al. |
| 6,328,871 B1 | | 12/2001 | Ding et al. |
| 6,350,946 B1 | | 2/2002 | Miyake et al. |
| 6,548,751 B2 | | 4/2003 | Sverdrup et al. |
| 7,141,863 B1 | | 11/2006 | Compaan et al. |
| 7,855,089 B2 | | 12/2010 | Farris, III et al. |
| 7,863,074 B2 | | 1/2011 | Wieting |
| 7,910,399 B1 | | 3/2011 | Wieting |
| 8,394,659 B1 | * | 3/2013 | Ding et al. .................. 438/57 |
| 2001/0050234 A1 | | 12/2001 | Shiepe |
| 2002/0026955 A1 | | 3/2002 | Ouchida et al. |
| 2002/0038663 A1 | | 4/2002 | Zenko et al. |
| 2003/0227017 A1 | | 12/2003 | Yasuno |
| 2005/0006228 A1 | | 1/2005 | Hyun |
| 2005/0056312 A1 | | 3/2005 | Young et al. |
| 2005/0109392 A1 | | 5/2005 | Hollars |
| 2005/0150542 A1 | | 7/2005 | Madan |
| 2005/0183962 A1 | | 8/2005 | Oakes |
| 2006/0037641 A1 | | 2/2006 | Kibbel et al. |
| 2006/0130890 A1 | | 6/2006 | Hantschel et al. |
| 2006/0180197 A1 | | 8/2006 | Gui et al. |
| 2006/0180464 A1 | | 8/2006 | Griffin |
| 2006/0220059 A1 | | 10/2006 | Satoh et al. |
| 2007/0089782 A1 | | 4/2007 | Scheuten et al. |
| 2007/0151596 A1 | | 7/2007 | Nasuno et al. |
| 2007/0160770 A1 | | 7/2007 | Stanberry |
| 2007/0169810 A1 | | 7/2007 | Van Duren et al. |
| 2008/0041446 A1 | | 2/2008 | Wu et al. |
| 2008/0092945 A1 | | 4/2008 | Munteanu et al. |
| 2008/0092953 A1 | | 4/2008 | Lee |
| 2008/0173390 A1 | | 7/2008 | Narasimhan et al. |
| 2008/0216885 A1 | | 9/2008 | Frolov et al. |
| 2008/0257751 A1 | | 10/2008 | Smola et al. |
| 2009/0020149 A1 | | 1/2009 | Woods et al. |
| 2009/0301562 A1 | | 12/2009 | Lee |
| 2009/0308437 A1 | | 12/2009 | Woods et al. |
| 2010/0051090 A1 | | 3/2010 | Lee |
| 2010/0078059 A1 | | 4/2010 | Lee |
| 2010/0099214 A1 | | 4/2010 | Buquing |
| 2010/0229921 A1 | | 9/2010 | Farris, III et al. |
| 2011/0017257 A1 | | 1/2011 | Lee |
| 2011/0017298 A1 | | 1/2011 | Lee |
| 2011/0168245 A1 | | 7/2011 | Lee |

OTHER PUBLICATIONS

Ellmer, K., et al., "Copper Indium Disulfide Solar Cell Absorbers Prepared in a One-Step Process by Reactive Magnetron Sputtering from Copper and Indium Targets", Thin Solid Films, 2002, vol. 413, pp. 92-97.

Gee, J. M., et al., "A 31%-Efficient GaAs/Silicon Mechanically Stacked, Multijunction Concentrator Solar Cell", 20th IEEE Photovoltaic Specialist Conference, IEEE Publishing, New York, NY, 1988, pp. 754-758.

Martil, I., et al., "Growth and physical properties of CuGaSe2 thin films by r.f. sputtering", Journal of Materials Science Letter, vol. 19, 1990, pp. 237-240.

Meyers, P.V., et al., "Polycrystalline CdTe on CuInSe2 Cascaded Solar Cells", Conference Record of the Twentieth IEEE Photovoltaic Specialists Conference, Las Vegas, NV, Sep. 26-30, 1988, pp. 1448-1451, vol. 2.

Onuma, Y., et al., "Preparation and Characterization of CuInS2 Thin Films Solar Cells with Large Grain", Solar Energy Materials & Solar Cells, 2001, vol. 69, pp. 261-269.

Rostan, P., et al. "Formation of Transparent and Ohmic ZnO:Al/ MoSe2 Contacts for Bifacial Cu (In, Ga)Se2 Solar Cells and Tandem Structures", Thin Solid Films, 2005, vol. 480-481, pp. 67-70.

Schorr, S., et al., "Electronic Band Gap of Zn2x(CuIn)1-xX2 Solid Solution Series (X=S, Se, Te)", Journal of Alloys and Compounds, 2006, vol. 414, No. 1-2 , pp. 26-30.

Symko-Davies, "NREL High-Performance Photovoltaic Project Kickoff Meeting, Identifying Critical Pathways", Oct. 18, 2001, 121 pages.

Wu, X., et al. "13.9%-Efficient CdTe Polycrystalline Thin-Film Solar Cells with an Infrared Transmission of ~ 50%", Progress in Photovoltaics: Research and Applications, 2006, vol. 14, pp. 471-483.

Young, D. L., et al. "Interconnect Junctions for Thin-Film Tandem Solar Cells", Proceedings of the 3rd World Conference on Photovoltaic Energy Conversion, Osaka, Japan, May 11, 2003, vol. 1, pp. 27-30.

International Search Report and Written Opinion for PCT Patent Application No. PCT/US2009/055243, mailed on Mar. 11, 2011, 12 pages.

International Search Report and Written Opinion for PCT Patent Application No. PCT/US2010/27342, mailed on May 17, 2010, 13 pages.

International Search Report & Written Opinion of PCT Patent Application No. PCT/US2009/0558829, date of mailing Nov. 25, 2009, 12 pages.

International Search Report & Written Opinion of PCT Patent Application No. PCT/US2009/046802, mailed on Jul. 31, 2009, 11 pages.

International Search Report and Written Opinion for PCT Patent Application No. PCT/US2009/046161 mailed on Jul. 27, 2009, 9 pages.

Final Office Action of Sep. 9, 2011 for U.S. Appl. No. 12/558,108, 20 pages.

Advisory Action of Aug. 19, 2011 for U.S. Appl. No. 12/512,978, 3 pages.

Final Office Action of Jun. 8, 2011 for U.S. Appl. No. 12/512,978, 16 pages.

Final Office Action of May 12, 2011 for U.S. Appl. No. 12/512,979, 14 pages.

Final Office Action of Apr. 12, 2011 for U.S. Appl. No. 12/562,086, 26 pages.

Non-Final Office Action of Mar. 1, 2011 for U.S. Appl. No. 12/558,108; 21 pages.

Non-Final Office Action of Dec. 23, 2010 for U.S. Appl. No. 12/512,978, 13 pages.

Final Office Action of Dec. 23, 2010 for U.S. Appl. No. 12/475,858, 28 pages.

Non-Final Office Action of Dec. 22, 2010 for U.S. Appl. No. 12/271,704; 14 pages.

Non-Final Office Action of Sep. 2, 2010 for U.S. Appl. No. 12/562,086; 14 pages.

Non-Final Office Action of Aug. 30, 2010 for U.S. Appl. No. 12/512,979, 13 pages.

Non-Final Office Action of Aug. 17, 2010 for U.S. Appl. No. 12/475,858, 22 pages.

* cited by examiner

MULTI-JUNCTION SOLAR CELL DEVICES

CROSS-REFERENCES TO RELATED APPLICATIONS

This application is a division of U.S. patent application Ser. No. 12/271,704 filed Nov. 14, 2008, which claims priority to U.S. Provisional Patent Application No. 60/988,414, filed Nov. 15, 2007 and U.S. Provisional Patent Application No. 60/988,099, filed Nov. 14, 2007, the disclosures of which are incorporated by reference herein in their entirety for all purposes.

BACKGROUND OF THE INVENTION

The present invention relates generally to photovoltaic cell structure. More particularly, the present invention provides a method and structure of a photovoltaic cell for manufacture of solar module using a thin film process. Merely by way of example, the present method and structure have been implemented using a multijunction configuration, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. These and other limitations of these conventional technologies can be found throughout the present specification and more particularly below.

From the above, it is seen that improved techniques for manufacturing photovoltaic cells and resulting devices are desired.

BRIEF SUMMARY OF THE INVENTION

According to embodiments of the present invention, techniques including structures for a multijunction solar device are provided. More particularly, embodiments according to the present invention provide a multijunction photovoltaic cell structure and a resulting photovoltaic device using thin film metal chalcogenide semiconductor materials and/or other suitable semiconductor films. But it would be recognized that the present invention has a broader range of applicability.

In a specific embodiment, a photovoltaic cell structure for manufacturing a photovoltaic device is provided. The photovoltaic cell structure includes a substrate member having a surface region. The photovoltaic cell structure includes a first conductor layer overlying the surface region of the substrate member. The photovoltaic cell structure includes a lower cell structure overlying the first conductor layer. In a specific embodiment, the lower cell structure includes a first P type absorber layer. The first P type absorber layer is characterized by a first bandgap ranging from about 0.5 to about 1.0 eV, but can be others. The first P type absorber layer is characterized by a first optical absorption coefficient greater than about $10^4$ $cm^{-1}$ in a wavelength range comprising 400 nm to 800 nm, but can be others. In a specific embodiment, the first P type absorber layer includes at least a first metal chalcogenide material and/or other suitable semiconductor material. The lower cell structure includes a first $N^+$ type window layer comprising at least a second metal chalcogenide material and/or other suitable semiconductor material overlying the first P type absorber layer. In a specific embodiment, the photovoltaic cell structure includes an upper cell structure. The upper cell structure includes a second P type absorber layer. The second P type absorber layer comprises at least a third metal chalcogenide material and/or other semiconductor material characterized by a second bandgap ranging from about 1.0 eV to 2.2 eV, but can be others. In an alternative embodiment, the second P absorber layer is characterized by a second bandgap ranging from 1.0 eV to about 2.0 eV, but can be others. In a preferred embodiment, the second P type absorber layer is characterized by a second bandgap ranging from about 1.2 eV to about 1.8 eV and a second optical absorption coefficient greater than about $10^4$ $cm^{-1}$ in a wavelength range comprising 400 nm to 800 nm. In a specific embodiment, the second bandgap is greater than the first bandgap. The upper cell structure includes a second $N^+$ window layer overlying the second P absorber layer. In a specific embodiment, the photovoltaic cell structure includes a $p^{++}/n^{++}$ layer disposed between the upper cell structure and the lower cell structure. In a specific embodiment, the $p^{++}/n^{++}$ layer provides a tunneling junction for the upper cell structure and the lower cell structure. In a specific embodiment, the photovoltaic cell structure includes an optional buffer layer overlying the second $N^+$ type window layer. The optional buffer layer is characterized by a resistivity greater than about 10 kohm-cm according to a specific embodiment. A second conductor structure is provided overlying the optional buffer layer. Of course, there can be other variations, modifications, and alternatives.

In an alternative embodiment, an alternative photovoltaic cell structure for manufacturing of a photovoltaic device is provided. The alternative photovoltaic cell structure includes a substrate including a surface region. The alternative photovoltaic cell structure includes a first conductor structure overlying the surface region of the substrate. The alternative photovoltaic cell structure a lower cell structure overlying the first conductor structure. The lower cell structure includes a first P type absorber layer. The first P type absorber layer includes a first metal chalcogenide material and/or other suitable semiconductor material, characterized by a first bandgap ranging from about 0.5 eV to about 1.0 eV and a first optical absorption coefficient greater than about $10^4$ cm$^{-1}$ in the wavelength range comprising 400 nm to 800 nm in a specific embodiment. The lower cell structure includes a first N$^+$ type window layer overlying the first P type absorber layer. The first N$^+$ type window layer can use a second semiconductor metal chalcogenide material and/or a suitable semiconductor material. The first P type absorber layer and the first N$^+$ type window layer form an interface region characterized by a first pn$^+$ junction. The alternative photovoltaic cell structure includes a second conductor structure overlying the lower cell structure. In a specific embodiment, an upper cell structure is provided overlying the second conductor structure. The upper cell structure includes a second P type absorber layer. In a specific embodiment, the second P type absorber uses a third metal chalcogenide material characterized by a second bandgap ranging from 1.2 eV to 2.2 eV and a second optical coefficient greater than about $10^4$ cm$^{-1}$ for the wavelength range comprising about 400 nm to about 800 nm. In a specific embodiment, the second bandgap is greater than the first bandgap. The upper cell structure includes a second N$^+$ type window layer overlying the second P type absorber layer. The alternative photovoltaic cell structure includes an optional buffer layer characterized by a resistivity greater than about 10 k-ohm cm overlying the second N$^+$ type window layer of the upper cell structure. A third conductor layer overlies the buffer layer.

In a yet alternative embodiment, a photovoltaic cell structure for manufacturing a photovoltaic device is provided. The photovoltaic cell structure includes a substrate having a surface region. The photovoltaic cell structure includes a first photovoltaic cell structure overlying the surface region of the substrate. The first photovoltaic cell structure includes a first conductor layer. The first photovoltaic cell structure includes a first P type absorber layer overlying the first conductor layer. In a specific embodiment, the first P type absorber layer uses a first semiconductor metal chalcogenide material and/or other suitable semiconductor material characterized by a first bandgap ranging from 0.5 eV to 1.0 eV and a first optical absorption coefficient greater than about $10^4$ cm$^{-1}$ in the wavelength range comprising about 400 nm to about 800 nm. The first photovoltaic cell structure includes a first N$^+$ type window layer overlying the first P type absorber layer. In a specific embodiment, the first N$^+$ type window layer includes at least a second semiconductor metal chalcogenide material and/or other suitable semiconductor material. A second conductor structure overlying the first N$^+$ type window layer. The photovoltaic cell structure includes a second photovoltaic cell structure. The second photovoltaic cell structure includes a third conductor structure. In a specific embodiment, a second P type absorber layer comprising a third semiconductor metal chalcogenide material characterized by a second bandgap ranging from about 1.0 eV to about 2.2 eV and a second optical absorption greater than $10^4$ cm$^{-1}$ in a wavelength range comprising 400 nm to 800 nm. In a specific embodiment, the second bandgap is greater than the first bandgap. A second N$^+$ type window layer overlies the second P type absorber layer. The second N$^+$ type window layer is formed using a fourth metal chalcogenide material. The second photovoltaic cell structure includes a fourth electrode structure overlying the second N$^+$ type window layer. In a specific embodiment, a glue layer or a laminating layer is provided to couple the first photovoltaic cell structure to the second photovoltaic cell.

In another specific embodiment, a method for manufacturing a photovoltaic device is provided. The method includes providing a first substrate including a first surface region. The method forms a first conductor layer overlying the surface region and a first P type absorber layer overlying the first conductor layer. In a specific embodiment, the first P type absorber layer includes a first metal chalcogenide material and/or other semiconductor material. Preferably, the first P type absorber layer is characterized by a first bandgap ranging from about 0.5 eV to about 1.0 eV, a first optical absorption coefficient greater than about $10^4$ cm$^{-1}$ in a wavelength range comprising about 400 nm to about 800 nm. The method includes forming a first N$^+$ type window layer overlying the first P type absorber layer. In a specific embodiment, the first N$^+$ type window layer includes a second metal chalcogenide material and/or other semiconductor material. A second conductor layer is formed overlying the first N$^+$ type window layer. In a specific embodiment, the first conductor layer, the first P type absorber layer, the first N$^+$ type window layer, and the second conductor layer provide for a first photovoltaic cell structure. The method includes providing a second substrate including a second surface region. A third conductor layer is formed overlying the second surface region and a second N$^+$ type window layer is formed overlying the third conductor layer. The method includes forming a second P type absorber layer overlying the second N$^+$ type window layer. In a specific embodiment, the second N$^+$ type window layer includes a third metal chalcogenide material characterized by a second bandgap ranging from 1.0 eV to 2.2 eV, a second optical absorption coefficient greater than about $10^4$ cm$^{-1}$ in a wavelength range comprising about 400 nm to about 800 nm. The method forms fourth conductor layer overlying the second P type absorber layer. In a specific embodiment, the third conductor layer, the second P type absorber layer, the second N$^+$ type window layer and the fourth conductor layer provide for a second photovoltaic cell structure. In a specific embodiment, a glue layer is provided between the first photovoltaic cell structure and the second photovoltaic cell structure. The glue layer is disposed between the second conductor layer and the forth conductor layer in a specific embodiment.

In a yet another embodiment, a method for manufacturing of a photovoltaic device is provided. The method includes providing a substrate including a surface region. A first conductor structure is formed overlying the surface region. A lower cell is formed overlying the first conductor structure. The lower cell includes a first P type absorber layer. In a specific embodiment, the first P type absorber layer includes a first metal chalcogenide material and/or other semiconductor material. The first P type absorber layer is characterized by a first bandgap ranging from about 0.5 eV to 1.0 eV, a first optical absorption coefficient greater than about $10^4$ cm$^{-1}$ in a wavelength range comprising about 400 nm to about 800 nm. The lower cell includes a first N$^+$ type window layer comprising a second metal chalcogenide material and/or other semiconductor material overlying the first P type absorber layer. The method forms a second conductor structure overlying the lower cell structure. The method includes forming an upper cell structure overlying the second conductor structure. The upper cell structure includes a second P type absorber layer.

The P type absorber layer includes a third metal chalcogenide material overlying the second conductor layer. In a specific embodiment, a bandgap ranging from 1.0 eV to 2.2 eV, and a second optical absorption coefficient greater than about $10^4$ cm$^{-1}$ in a wavelength range comprising about 400 nm to about 800 nm characterize the second P type absorber layer. The upper cell structure includes a second N$^+$ type window layer overlying the second P type absorber layer. In a specific embodiment, the method forms a buffer layer overlying the second N$^+$ type window layer of the upper cell structure. The buffer layer is characterized by a resistivity greater than about 10 k-ohm cm in a specific embodiment. A third conductor layer is formed overlying the buffer layer.

In a still yet another embodiment, a method for manufacturing a photovoltaic device is provided. The method includes providing a substrate including a surface region. A first conductor layer is formed overlying the surface region and a lower cell structure is formed overlying the first conductor layer. The lower cell structure includes a first P type absorber including at least a first metal chalcogenide material and/or other suitable semiconductor material overlying the first conductor layer. The first P type absorber material is characterized by a first bandgap ranging from 0.5 eV to 1.0 eV, a first optical absorption coefficient greater than about $10^4$ cm$^{-1}$, and a first thickness ranging from 0.5 um to 2 um. The lower cell structure includes a first N$^+$ type window layer comprising at least a second metal chalcogenide material and/or other suitable semiconductor material overlying the first P type absorber layer. In a specific embodiment, the method forms a tunneling junction layer overlying the first N$^+$ type window layer of the lower cell. The tunneling junction layer includes at least a p$^{++}$ type semiconductor material and an n$^{++}$ type semiconductor material in a specific embodiment. The method includes forming an upper cell structure. The upper cell structure includes a second P type absorber material overlying the tunneling junction layer. In a specific embodiment, the second P type absorber material includes at least a third metal chalcogenide material. In a specific embodiment, the second P type absorber material is characterized by a second bandgap ranging from 1.0 eV to 2.2 eV, a second optical absorption coefficient greater than about $10^4$ cm$^-$, and a second thickness ranging from 0.5 um to 2 um. A second N$^+$ type window layer comprising at least a fourth metal chalcogenide material is formed overlying the second absorber layer. The method includes forming a buffer layer overlying the second N$^+$ type window layer of the upper cell structure. The buffer layer is characterized by a resistivity greater than about 10 kohm-cm in a specific embodiment. A second conductor layer is formed overlying the buffer layer.

Depending on the embodiment, one or more of these features may be included. The present invention provides a multijunction solar cell structure using metal chalcogenides and other semiconductor materials. The present structure can be provided using easy to use processes using convention equipment without further modifications. Depending upon the embodiment, each of the metal chalcogenide semiconductor material may provided as nanostructured or in bulk. In a specific embodiment, the present solar cell structure provides a higher conversion efficiency in converting sunlight into electric energy. Depending on the embodiment, the conversion efficiency may be 15 percent to 20 percent or greater for the resulting multijunction solar cell. Additionally, the present multijunction solar cell structure can be provided using large scale manufacturing processes, which reduce cost in manufacturing of the photovoltaic devices. Depending on the embodiments, one or more of these benefits may be achieved. These benefits will be described more fully throughout the present specification, and particularly below.

DETAILED DESCRIPTION OF THE INVENTION

According to embodiments of the present invention, techniques directed to photovoltaic cell structure are provided. More particularly, embodiments according to the present invention provide a multijunction photovoltaic cell structure and a resulting photovoltaic cell having a high conversion efficiency. But it would be recognize that embodiments according to the present invention have a much broader range of applicability.

Figure 1:
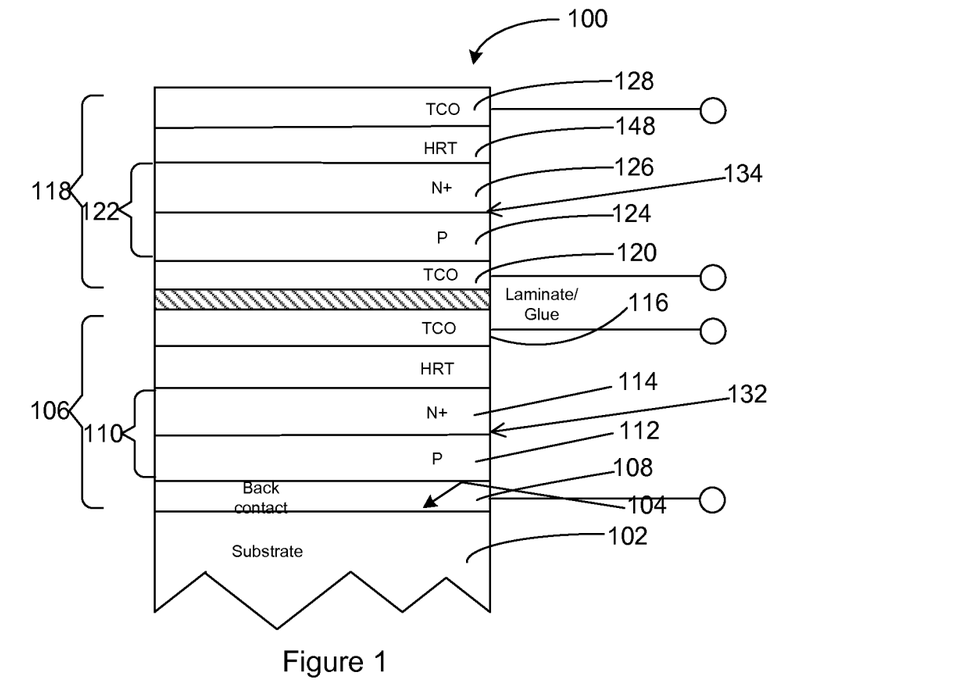
FIG. 1 is a simplified diagram illustrating a photovoltaic cell structure according to an embodiment of the present invention.

FIG. 1 is a simplified diagram illustrating a photovoltaic cell structure 100 for manufacturing a multijunction solar module according to an embodiment of the present invention. As shown, the photovoltaic cell structure includes a substrate member 102 having a surface region 104. The substrate member can be made of an insulator material, a conductor material, or a semiconductor material, depending on the application. In a specific embodiment, the conductor material can be nickel, molybdenum, aluminum, or a metal alloy such as stainless steel and the likes. In a specific embodiment, the semiconductor material may include silicon, germanium, silicon germanium, compound semiconductor material such as III-V materials, II-VI materials, and others. In a specific embodiment, the insulator material can be a transparent material such as glass, quartz, fused silica, and the like. Alternatively, the insulator material can be a polymer material, a ceramic material, or a layer material or a composite material depending on the application. The polymer material may include acrylic material, polycarbonate material, and others, depending on the embodiment. Of course, there can be other variations modifications, and alternatives.

As shown in FIG. 1, the photovoltaic cell structure includes a first photovoltaic cell structure 106. In a specific embodiment, the first photovoltaic cell structure includes a first electrode structure 108. In a specific embodiment, the first electrode structure uses a first conductor material characterized by a resistivity less than about 10 ohm-cm. The first electrode structure can be made of a suitable material or a combination of materials. The first electrode structure can be made from a transparent conductive electrode or materials that are light reflecting or light blocking depending on the embodiment. Examples of the transparent conductive electrode can include indium tin oxide (ITO), aluminum doped zinc oxide, fluorine doped tin oxide and others. In a specific embodiment, the transparent conductive electrode may be provide using techniques such as sputtering, chemical vapor deposition, electrochemical deposition, and others. In a specific embodiment, the first electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Alternatively, the first electrode structure may be made of a carbon based material such as carbon or graphite. Yet alternatively, the first electrode structure may be made of a conductive polymer material, depending on the application. Of course there can be other variations, modifications, and alternatives, modifications, and alternatives.

Referring again to FIG. 1, the first photovoltaic cell structure includes a lower cell 110 overlying the first electrode structure. In a specific embodiment, the lower cell includes a first absorber layer 112 characterized by a P type impurity characteristics. That is, the first absorber layer absorbs electromagnetic radiation forming positively charged carriers within the first absorber layer. In a specific embodiment, the first absorber layer comprises a first metal chalcogenide semiconductor material and/or other suitable semiconductor material. The first absorber layer is characterized by a bandgap. In a specific embodiment, the first absorber layer has a first bandgap of ranging from about 0.7 eV to about 1.2 eV. In an alternative embodiment, the first absorber layer can have a first bandgap of about 0.5 eV to about 1.2 eV. In a preferred embodiment, the first absorber layer can have a bandgap of about 0.5 eV to about 1.0 eV. The first metal chalcogenide semiconductor material can include a suitable metal oxide. Alternatively, the first metal chalcogenide semiconductor material can include a suitable metal sulfide. Yet alternatively first metal chalcogenide semiconductor material can include a metal telluride or metal selenide depending on the application. In certain embodiments, the first absorber layer can be provided using a metal silicide material such as iron disilicide material, which has a P type impurity characteristics, and others. In a specific embodiment, the first absorber layer can be deposited using techniques such as sputtering, spin coating, doctor blading, powder coating, electrochemical deposition, inkjeting, among others, depending on the application. Of course there can be other variations, modifications, and alternatives.

In a specific embodiment, the first absorber layer has an optical absorption coefficient greater than about $10^4$ cm$^{-1}$ for electromagnetic radiation in a wavelength range of about 400 nm to about 800 nm. In an alternative embodiment, the first absorber layer can have an optical absorption coefficient greater than about $10^4$ cm$^{-1}$ for electromagnetic radiation in a wavelength range of about 450 nm to about 700 nm. Of course there can be other variations, modifications, and alternatives.

Referring to FIG. 1, the lower cell includes a first window layer 114 overlying the first absorber layer. In a specific embodiment, the first window layer has a N$^+$ impurity type characteristics. In a preferred embodiment, the first window layer is characterized by a bandgap greater than about 2.5 eV, for example ranging from 2.5 eV to about 5.5 eV. In a specific embodiment, the first window layer comprises a second metal chalcogenide semiconductor material and/or other suitable semiconductor material. Alternatively, the second metal chalcogenide semiconductor material can comprise a semiconductor metal sulfide, a semiconductor metal oxide, a semiconductor metal telluride or a semiconductor metal selenide material. In certain embodiments, the first window layer may use an n-type zinc sulfide material for a iron disilicide material as the first absorber layer. In a specific embodiment, the first window layer can be deposited using techniques such as sputtering, spin coating, doctor blading, powder coating, electrochemical deposition, inkjeting, among others, depending on the application. Of course there can be other variations, modifications, and alternatives.

Again referring to FIG. 1, the first photovoltaic cell structure includes a second electrode structure 116 overlying the lower cell in a specific embodiment. The second electrode structure is in electrical contact with the window layer in a specific embodiment. In a specific embodiment, the second electrode structure uses a conductor material characterized by a resistivity less than about 10 ohm-cm. In a specific embodiment, the second electrode structure can be made of a suitable material or a combination of materials. The second electrode structure is preferably made from a transparent conductive electrode material. Materials that are light reflecting or light blocking may also be used depending on the embodiment. Examples of the optically transparent material can include indium tin oxide (ITO), aluminum doped zinc oxide, fluorine doped tin oxide and others. In an alternative embodiment, the second electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Yet alternatively, the second electrode structure may be made of a carbon based material such as carbon or graphite. In certain embodiments, the second electrode structure may be made of a conductive polymer material, depending on the application. Of course there can be other variations, modifications, and alternatives.

As shown in FIG. 1, photovoltaic cell structure 100 includes a second photovoltaic cell structure 118. In a specific embodiment, the second photovoltaic cell structure includes a third electrode structure 120. In a specific embodiment, the third electrode structure uses a conductor material characterized by a resistivity less than about 10 ohm-cm. In a specific embodiment, the third electrode structure can be made of a suitable material or a combination of materials. The third electrode structure is preferably made from a transparent conductive electrode. Materials that are light reflecting or light blocking may also be used depending on the embodiment. Examples of the optically transparent material can include indium tin oxide (ITO), aluminum doped zinc oxide, fluorine doped tin oxide and others. In an alternative embodiment, the second electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition, and others. Yet alternatively, the second electrode structure may be made of a carbon based material such as carbon or graphite. In certain embodiments, the second electrode structure may be made of a conductive polymer material, depending on the application. Of course there can be other variations, modifications, and alternatives.

The upper photovoltaic cell includes an upper cell 122 overlying the third electrode structure. The upper cell includes a second absorber layer 124 overlying the third electrode structure. In a specific embodiment, the second absorber layer is characterized by a P type impurity characteristics. That is, the second absorber layer absorbs electromagnetic radiation forming positively charged carriers within the second absorber layer. In a specific embodiment, the second absorber layer comprises a third metal chalcogenide semiconductor material. The third metal chalcogenide semiconductor material is characterized by a second bandgap. In a specific embodiment, the second bandgap is greater than the first bandgap. In a specific embodiment, the second bandgap can range from about 1.0 eV to about 2.2 eV. In an alternative embodiment, the second bandgap can range from about 1.0 eV to about 2.5 eV. In a preferred embodiment, the third bandgap can range from about 1.2 eV to about 1.8 eV. The third metal chalcogenide semiconductor material can include a suitable semiconductor metal oxide. Alternatively, the third metal chalcogenide semiconductor material can include a suitable metal sulfide. Yet alternatively third metal chalcogenide semiconductor material can include a suitable semiconductor metal telluride or metal selenide depending on the application. In a specific embodiment, the second absorber layer is provided using a copper oxide material, which has a p type impurity characteristics. Of course there can be other variations, modifications, and alternatives.

Referring again to FIG. 1, the upper cell includes a second window layer 126. In a specific embodiment, the second window layer has a $N^+$ impurity type characteristics. In a specific embodiment, the second window layer is characterized by a bandgap greater than about 2.5 eV, for example, ranging from about 2.5 eV to 5.0 eV. In a specific embodiment, the second window layer comprises a fourth metal chalcogenide semiconductor material. The fourth metal chalcogenide semiconductor material can include a suitable semiconductor metal sulfide, a suitable semiconductor metal oxide, a suitable semiconductor metal telluride or a suitable semiconductor metal selenide material. In a specific embodiment, the second window layer may be provided using a zinc sulfide material, which has an N type impurity characteristics. In a specific embodiment, the second window layer may be deposited using techniques such as sputtering, doctor blading, inkjeting, electrochemical deposition, and others.

In a specific embodiment, the second photovoltaic cell structure includes a fourth electrode structure 128 overlying the upper cell. In a specific embodiment, the fourth electrode structure uses a conductor material characterized by a resistivity less than about 10 ohm-cm. In a specific embodiment, the fourth electrode structure can be made of a suitable material or a combination of materials. The fourth electrode structure is preferably a transparent conductive electrode. Materials that are light reflecting or light blocking may also be used depending on the embodiment. Examples of the transparent conductive electrode can include indium tin oxide (ITO), aluminum doped zinc oxide, fluorine doped tin oxide and others. In an alternative embodiment, the fourth electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Yet alternatively, the fourth electrode structure may be made of a carbon based material such as carbon or graphite. In certain embodiments, the fourth electrode structure may be made of a conductive polymer material, depending on the application. Of course there can be other variations, modifications, and alternatives.

Figure 2:
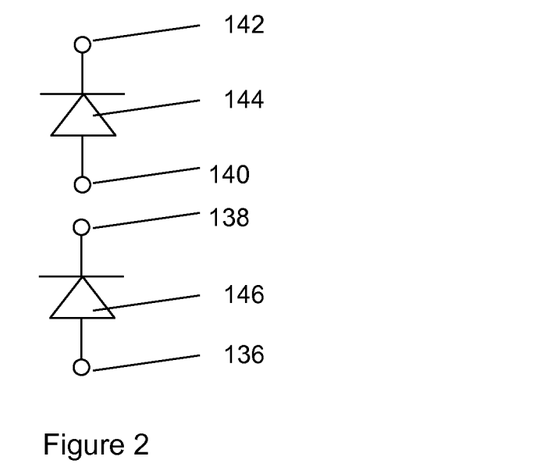
FIG. 2 is a simplified circuit diagram illustrating the photovoltaic cell structure in FIG. 1.

In a specific embodiment, the first photovoltaic cell structure and the second photovoltaic cell structure are coupled together using a glue layer 130 to form a multijunction photovoltaic cell structure as shown in FIG. 1. As shown, photovoltaic cell structure 100 includes a first junction region 132 caused by the first absorber layer and the first window layer. Photovoltaic cell structure 100 includes also a second junction region 134 caused by the second absorber layer and the second window layer. The glue layer is a suitable material that has desirable optical and mechanical characteristics. Such material can be ethyl vinyl acetate or polyvinyl butyral and the like, but can also be others. As shown in FIG. 2 a simplified circuit representation 130 of the multijunction cell structure is depicted. As shown, the multijunction photovoltaic cell structure has four terminals 136, 138, 140, and 142 provided by the first electrode structure, the second electrode structure, the third electrode structure, and the fourth electrode structure. The multijunction photovoltaic cell has two photodiodes 144 and 146 as provided by the upper cell and the lower cells. Of course one skilled in the art would recognize other variations, modifications, and alternative.

In a specific embodiment, the photovoltaic cell structure can have an optional buffer layer 148 disposed between the second conductor structure and the second absorber layer of the upper cell as shown in FIG. 1. The optional buffer layer is characterized by a resistivity greater than about 10 kohm-cm and is preferably optically transparent in a specific embodiment. Of course there can be other variations, modifications, and alternatives.

Figure 3:
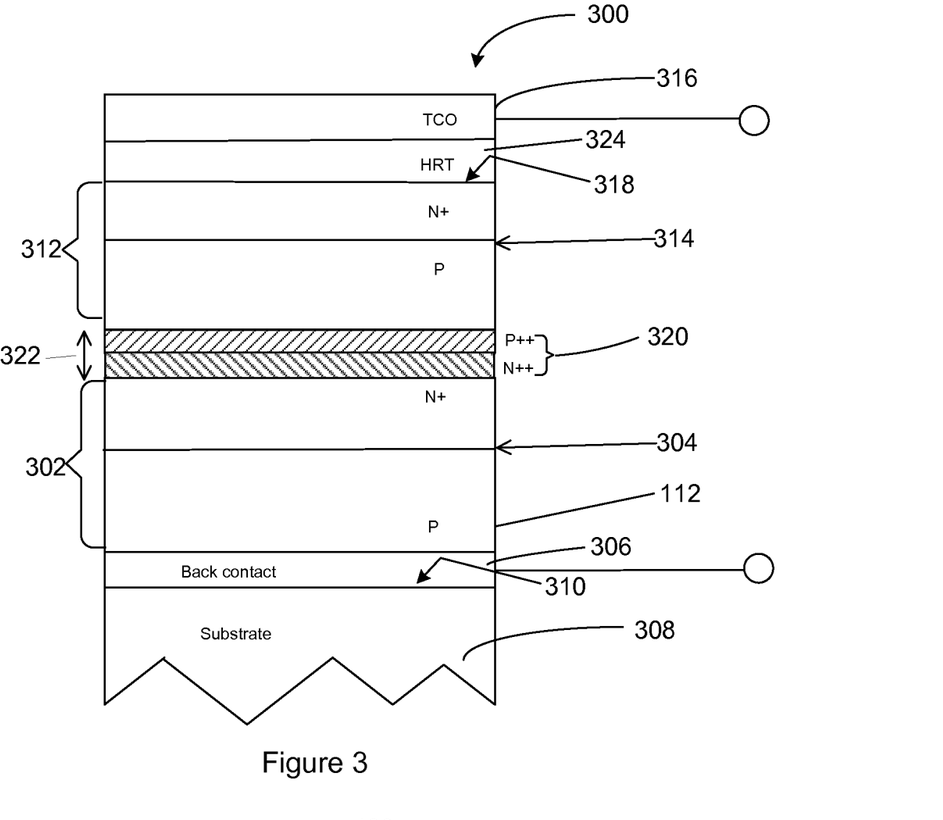
FIG. 3 is a simplified diagram illustrating an alternative photovoltaic cell structure according to an embodiment of the present invention.

FIG. 3 is a simplified diagram illustrating another photovoltaic cell structure 300 for manufacture of a multijunction solar cell module according to an alternative embodiment of the present invention. Photovoltaic cell structure 300 is configured to have two junctions and two electrode. As shown, photovoltaic cell structure 300 includes a lower cell 302 which includes a first $pn^+$ junction 304. The lower cell can have a same material composition as the lower cell as described above in connection with the photovoltaic cell structure in FIG. 1. The lower cell is in electrical contact with a first electrode structure 306 which overlies a surface region 310 of a substrate member 308 also as described above for FIG. 1.

Photovoltaic cell 300 includes an upper cell 312 which includes a second $pn^+$ junction 314. The upper cell also has a same material composition as the upper cell as described above in connection with the photovoltaic cell structure in FIG. 1. A second electrode structure 316 overlies and in electrical contact with a surface region 318 of the upper cell.

In a specific embodiment, a tunneling junction layer 320 is provided between the upper cell and the lower cell as shown in FIG. 3. The tunneling junction layer comprises a p++/n++ layer and is characterized by a thickness 322. In a specific embodiment, the tunneling junction layer can be adjusted, either by way of thickness, or by way of dopant characteristics, to provide an optimized current flow between the upper cell and the lower cell. Of course there can be other variations, modifications, and alternatives.

Optionally, photovoltaic cell structure 300 can include a buffer layer 324, which is optional, disposed between the second conductor structure and the upper cell. The buffer layer prevents diffusion of, for example, electrode materials into the photovoltaic cell in subsequent high temperature processing steps. Buffer layer 324 may be made from a high resistance transparent material having a resistivity greater than 10 kOhm-cm in a specific embodiment. Example of such high resistance transparent material can include intrinsic semiconductor such as intrinsic zinc oxide, intrinsic zinc sulfide and the like. Of course there can be other variations, modifications, and alternatives.

Figure 4:
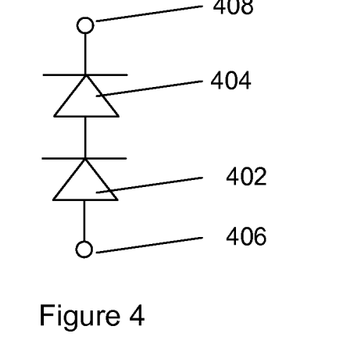
FIG. 4 is a simplified circuit diagram illustrating the photovoltaic cell structure in FIG. 2.

FIG. 4 is a simplified circuit diagram for photovoltaic cell structure 300 according to an embodiment of the present invention. As shown, the photovoltaic cell structure includes a first photodiode 402, a second photodiode 404, a first electrode terminal 406, and a second electrode terminal 408. Photovoltaic cell structure 300 can be characterized by two junctions, provided by each of the photodiodes and two electrode terminals. The first photodiode and the second photodiode are connected in series by means of the tunneling junction. Of course there can be other variations, modifications, and alternatives.

Figure 5:
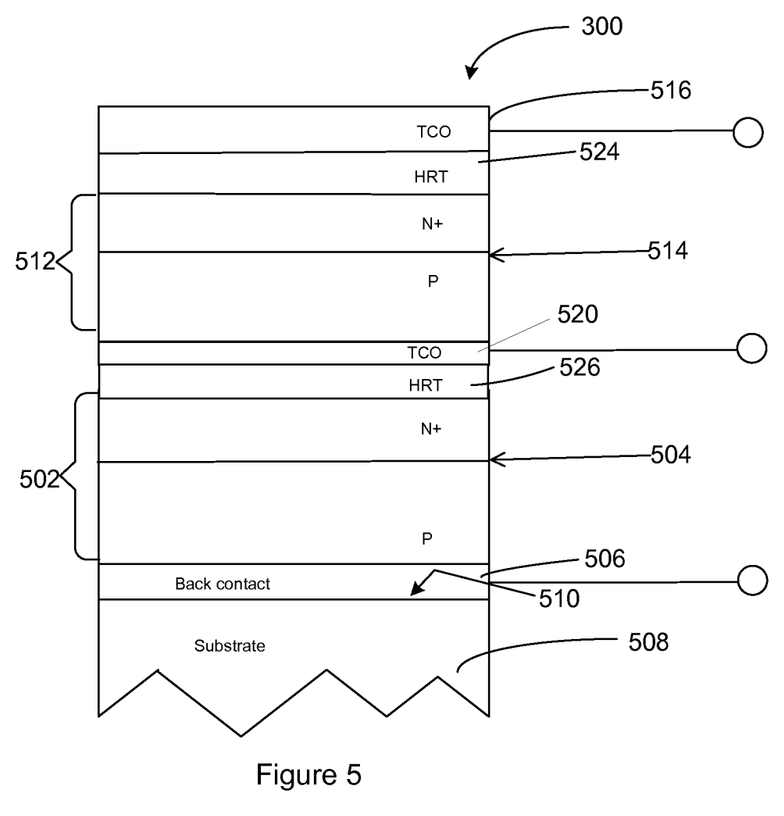
FIG. 5 is a simplified diagram illustrating an alternative photovoltaic cell structure according to an embodiment of the present invention.

FIG. 5 is a simplified diagram illustrating a photovoltaic cell structure 500 for manufacturing of a multijunction solar module according to another alternative embodiment of the present invention. Photovoltaic cell structure 500 is configured to have two junctions and three electrode terminals. As shown, photovoltaic cell structure 500 includes a lower cell 502 which includes a first $pn^+$ junction 504. The lower cell can have a same material composition as the lower cell as described above in connection with the photovoltaic cell structure in FIG. 1. The lower cell is in electrical contact with a first electrode structure 506 which overlies a surface region 510 of a substrate member 508 also as described above for FIG. 1.

Photovoltaic cell structure 500 includes an upper cell 512 which includes a second $pn^+$ junction 514. The upper cell can have a same material composition as the upper cell as described above in connection with the photovoltaic cell structure in FIG. 1. A second electrode structure 516 overlies and in electrical contact with the upper cell.

In a specific embodiment, a third conductor structure 520 is provided between the upper cell and the lower cell as shown in FIG. 5. The third conductor structure connects the upper cell and the lower cell in series in a specific embodiment. In a specific embodiment, the third conductor structure is characterized by a resistivity less than about 10 ohm-cm. The third electrode structure can be made of a suitable material or a combination of materials. The third electrode structure is preferably made from a transparent conductive electrode or materials. Examples of the transparent conductive material can include indium tin oxide (ITO), aluminum doped zinc oxide, fluorine doped tin oxide and others. In an alternative embodiment, the third electrode structure may be made from a metal material. The metal material can include gold, silver, nickel, platinum, aluminum, tungsten, molybdenum, a combination of these, or an alloy, among others. In a specific embodiment, the metal material may be deposited using techniques such as sputtering, electroplating, electrochemical deposition and others. Yet alternatively, the third electrode structure may be made of a carbon based material such as carbon or graphite. In certain embodiments, the third electrode structure may be made of a conductive polymer material, depending on the application. Of course there can be other variations, modifications, and alternatives.

In certain embodiments, the photovoltaic cell structure 500 can include an optional first buffer layer 524 disposed between the second conductor structure and the upper cell as shown in FIG. 5. Photovoltaic cell structure 500 can also include an optional second buffer layer 526 provided between the third electrode structure and the lower cell. These buffer layers prevent diffusion of, for example, electrode materials into the respective photovoltaic cells in subsequent high temperature processing steps. In a specific embodiment, the buffer layers are characterized by a resistivity greater than about 10 kohm-cm and can be provided using a suitable metal oxide. Of course there can be other variations, modifications, and alternatives.

Figure 6:
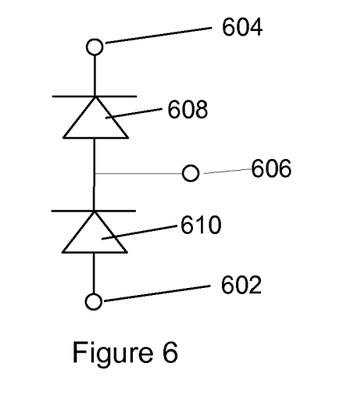
FIG. 6 is a simplified circuit diagram illustrating the photovoltaic cell structure in FIG. 5.

FIG. 6 is a simplified circuit representation 600 of the photovoltaic cell structure in FIG. 5. As shown in FIG. 6, the photovoltaic cell structure has 3 terminals 602, 604, and 606 provided by the first electrode structure, the second electrode structure, and the third electrode structure The photovoltaic cell has two photodiodes 608 and 610 as provided by the upper cell and the lower cell. Of course one skilled in the art would recognize other variations, modifications, and alternative.

Figure 7:
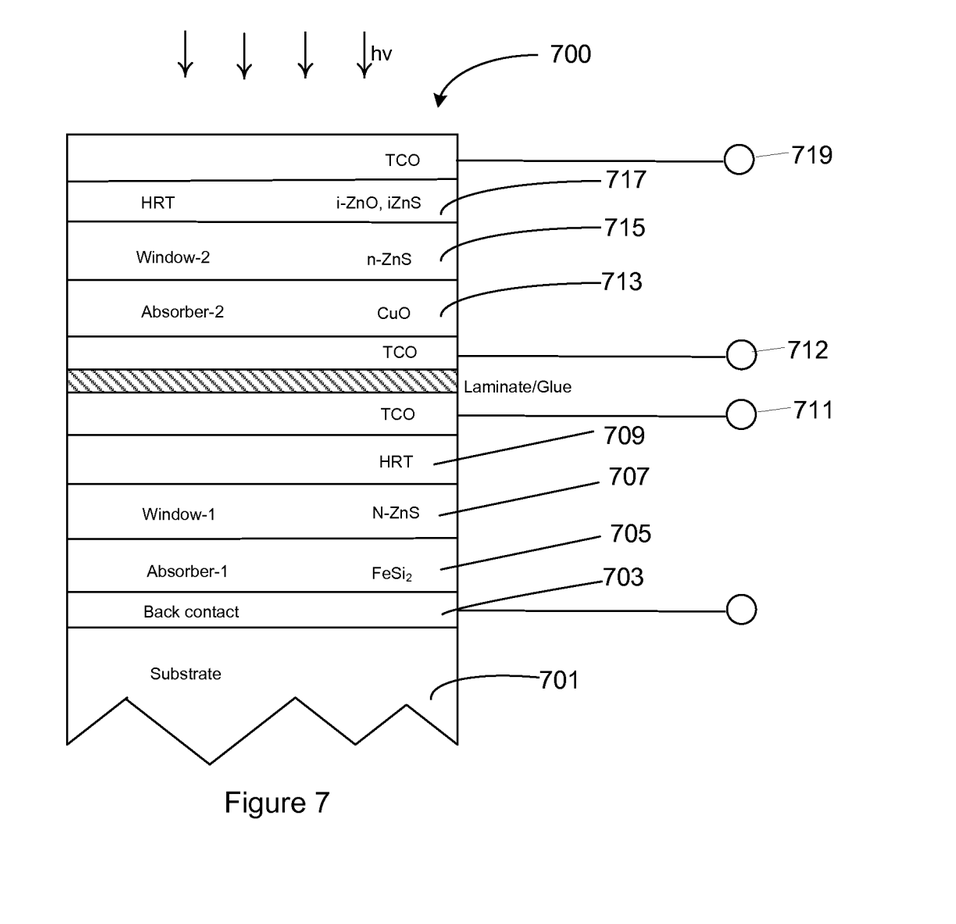
FIG. 7 is a simplified diagram illustrating an example of a photovoltaic cell structure according to an embodiment of the present invention.

FIG. 7 is a simplified cross-sectional view of an example of a hetero junction cell 700 according to an embodiment of the present invention. As shown, the cell has a substrate 701 including a surface region. In a specific embodiment, the substrate can be a glass material, although other materials can be used. In a specific embodiment, the cell has a first conductor layer 703, which is a back contact, overlying the surface region. As an example, the back contact is a metal material. To define the lower cell structure, a first P type absorber (e.g., P-) comprising an iron disilicide material 705 is included. Further details of forming iron disilicide material have been described in U.S. patent application Ser. No. 12/209,801 filed Sep. 12, 2008, which claims priority to U.S. Provisional Application No. 60/976,239, filed Sep. 28, 2007 and Ser. No. 12/210,173 filed Sep. 12, 2008, which claims priority to U.S. Provisional Application 60/976,317, filed Sep. 28, 2007), and hereby incorporate by reference for all purpose. In a specific embodiment, a first $N^+$ type window layer is included. In a specific embodiment, the first $N^+$ type window layer is provided by a N—ZnS material. In a specific embodiment, a high resistance transparent layer 709, which is optional, overlies the first $N^+$ type window layer. As an example, the high resistance layer can be intrinsic ZnS, intrinsic ZnO or other suitable materials.

Overlying the lower cell is a transparent conductive oxide 711, which can be ZnO (doped with aluminum), $SnO_3$ (doped with fluorine), or other suitable materials. Disposed between the lower and upper cells is a lamination layer and can be a glue layer, which is optically transparent. The lamination layer may be provided using an EVA material or a PVB material in a specific embodiment. To form an upper cell structure, a third transparent conductive oxide 712 is provided according to a specific embodiment. A second P type absorber layer 713 comprising a copper oxide material or other suitable material is formed overlying transparent conductive oxide 712. A second $N^+$ type window layer 715 comprising an n—ZnS material is overlying the second P type absorber layer. In a specific embodiment, a second high resistance transparent layer 717 is overlying the second $N^+$ type window layer. As an example, the second high resistance transparent layer 717 can be intrinsic ZnS, intrinsic ZnO, or other suitable materials. A transparent conductive oxide 719 is formed overlying high resistance transparent layer 717 according to a specific embodiment. Of course, depending upon the embodiment, the materials and/layers specified can be applied to other cell configurations such as three electrode, two electrode, and others.

It is also understood that the examples and embodiments described herein are for illustrative purposes only and that various modifications or changes in light thereof will be suggested to persons skilled in the art. For example, embodiments according to the present invention have been described using a two cell configuration. It is understood that the present invention can be extended to include N cells (N≥2). Various modifications and changes are to be included within the spirit and purview of this application and scope of the appended claims.

What is claimed is:

1. A photovoltaic cell structure for manufacturing a photovoltaic device, the photovoltaic cell structure comprises:
   a substrate including a surface region;
   a first conductor layer overlying the surface region;
   a lower cell structure, the lower cell structure comprising
      a first P type absorber comprising at least a first metal chalcogenide material and/or other suitable semiconductor material overlying the first conductor layer, the first P type absorber material being characterized by a first bandgap ranging from 0.5 eV to 1.0 eV, a first optical absorption coefficient greater than about $10^4$ $cm^{-1}$, and a first thickness ranging from 0.5 µm to 2 µm;
      a first N+ type window layer comprising at least a second metal chalcogenide material and/or other suitable semiconductor material overlying the first P type absorber layer;
   an upper cell structure, the upper cell structure comprising:
      a second P type absorber material comprising at least a third metal chalcogenide material, the second P type absorber material being characterized by a second bandgap ranging from 1.0 eV to 2.2 eV and a second optical absorption coefficient greater than about $10^4$ $cm^{-1}$, a second thickness ranging from 0.5 µm to 2 µm, wherein the second P type absorber material comprises a copper oxide material;
      a second N+ type window layer comprising at least a fourth metal chalcogenide material overlying the second absorber layer, wherein the fourth metal chalcogenide comprises zinc sulfide;
   a buffer layer overlying the second N+ type window layer of the upper cell structure; the buffer layer being characterized by a resistivity greater than about 10 kohm-cm; and
   a second conductor layer overlying the buffer layer; and
   an adhesion layer disposed between the first N+ type window layer and the second P type absorber material.

2. The photovoltaic cell structure of claim 1 wherein the substrate is a semiconductor or a compound semiconductor material.

3. The photovoltaic cell structure of claim 1 wherein the first metal chalcogenide material is selected from a semiconductor metal oxide, a semiconductor metal sulfide, a semiconductor metal selenide, or semiconductor metal telluride.

4. The photovoltaic cell structure of claim 1 wherein the second metal chalcogenide material is selected from a semiconductor metal oxide, a semiconductor metal sulfide, a semiconductor metal selenide, or a semiconductor metal telluride, or a semiconductor metal silicide.

5. The photovoltaic cell structure of claim 1 wherein the first P type absorber layer comprises an iron disilicide material.

6. The photovoltaic cell structure of claim 1 wherein the first N+ type window layer comprises a zinc sulfide material.

7. The photovoltaic cell structure of claim 1 wherein the second N+ window layer comprises a zinc sulfide material.

8. The photovoltaic cell structure of claim 1 wherein the first bandgap is less than the second bandgap.

9. The photovoltaic cell structure of claim 1 wherein the first conductor layer comprises a transparent conducting oxide material selected from ZnO:Al, SnO:F, or ITO.

10. The photovoltaic cell structure of claim 1 wherein the second conductor layer comprises a transparent conducting oxide material selected from ZnO:Al, SnO:F, or ITO.

11. The photovoltaic cell structure of claim 1 wherein the adhesion layer comprises ethyl vinyl acetate or polyvinyl butyral.

12. The photovoltaic cell structure of claim 1, wherein the buffer comprises intrinsic zinc sulfide.

* * * * *